(12) United States Patent
Briere

(10) Patent No.: US 7,348,656 B2
(45) Date of Patent: Mar. 25, 2008

(54) POWER SEMICONDUCTOR DEVICE WITH INTEGRATED PASSIVE COMPONENT

(75) Inventor: Michael A. Briere, Manhattan Beach, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 11/524,694

(22) Filed: Sep. 21, 2006

(65) Prior Publication Data
US 2007/0063231 A1    Mar. 22, 2007

Related U.S. Application Data

(60) Provisional application No. 60/719,390, filed on Sep. 22, 2005.

(51) Int. Cl.
*H01L 29/00*    (2006.01)

(52) U.S. Cl. .............. 257/532; 257/277; 257/379; 257/535; 257/E27.016; 257/E27.025; 257/E27.034; 257/E27.048; 257/E27.071

(58) Field of Classification Search ............... 257/277, 257/379, 532, 535, E27.016, E27.025, E27.034, 257/E27.048, E27.071
See application file for complete search history.

(56) References Cited

U.S. PATENT DOCUMENTS 5,731,627 A * 3/1998 Seok ...................... 257/630
2002/0105080 A1* 8/2002 Speakman .............. 257/749

* cited by examiner

*Primary Examiner*—Minhloan Tran
*Assistant Examiner*—Benjamin Tzu-Hung Liu
(74) *Attorney, Agent, or Firm*—Ostrolenk, Faber, Gerb & Soffen, LLP

(57) ABSTRACT

A power semiconductor device that includes a passive component, e.g., a capacitor, mechanically and electrically coupled to at least one pole thereof.

13 Claims, 2 Drawing Sheets

POWER SEMICONDUCTOR DEVICE WITH INTEGRATED PASSIVE COMPONENT

RELATED APPLICATION

This application claims benefit of U.S. Provisional Application Ser. No. 60/719,390, filed Sep. 22, 2005, entitled Power Semiconductor Device With Integrated Passive Component to which a claim of priority is hereby made.

BACKGROUND

The present invention relates to power semiconductor devices and more particularly to a power semiconductor device that includes an integrated passive component such as a capacitor.

Most power applications require the use of a capacitor. FIG. 1 is an example of a power application in which a capacitor 10 is used in a circuit 12 in conjunction with a plurality of power semiconductor die (e.g. power MOSFETs) 14. FIG. 1 also shows another circuit 12' that includes power semiconductor die 14', which is driven by circuit 12, that is operatively connected to a respective capacitor 10'.

Typically, a capacitor is arranged within a power application circuit in the form of a discreet, passive component. As a result, the physical size of the circuit is increased due to the addition of capacitors in discreet form.

In addition, the fabrication of a power application circuit is complicated when the number of discreet components is increased.

To overcome the drawbacks of the prior art, a component according to the present invention includes a power semiconductor die having an integrated capacitor component.

SUMMARY OF THE INVENTION

A power semiconductor device according to the present invention includes a discreet power semiconductor switch (e.g. a power MOSFET) and a capacitor mechanically coupled to a major portion of said power semiconductor switch and having a first conductive plate, a second conductive plate and a dielectric body disposed between said first conductive plate and said second conductive plate, wherein said first conductive plate is electrically coupled to a power pole of said power semiconductor switch.

According to one embodiment of the present invention, the power semiconductor switch includes a first power electrode and a second power electrode, wherein said first conductive plate is electrically connected to said first power electrode. Preferably, a dielectric spacer is disposed between said first power electrode and said first conductive plate serving to mechanically couple said first conductive plate to said first power electrode. The first conductive plate is electrically connected to said first power electrode through a conductive filled via or a plurality of conductive filled vias in said dielectric spacer.

According to another embodiment of the present invention, the first conductive plate is directly mechanically and electrically coupled to the semiconductor body of said power semiconductor switch. For example, the first conductive plate is directly mechanically and electrically coupled to the drain region of a power MOSFET.

DETAILED DESCRIPTION OF THE FIGURES

Figure 2:
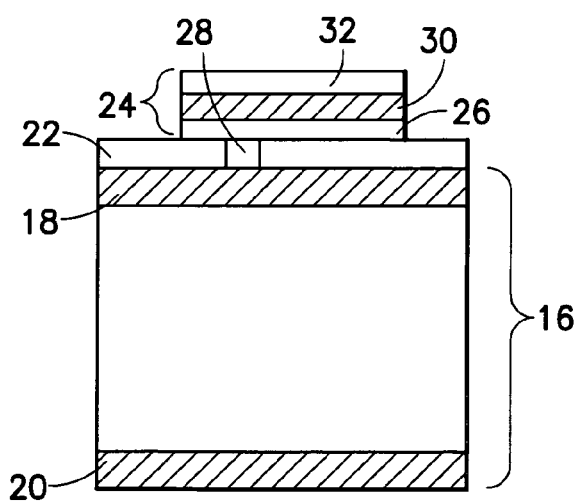
FIG. 2 illustrates a cross-sectional view of a power semiconductor device according to one embodiment of the present invention.

Referring specifically to FIG. 2, a device according to the present invention is a power semiconductor device, such as a power MOSFET 16, having a source electrode 18, and a drain electrode 20. According to the present invention a dielectric spacer 22 is formed over source electrode 18 of MOSFET 16, and a capacitor 24 is formed over dielectric spacer 22. Capacitor 24 includes a first conductive plate 26 (formed preferably with copper) electrically connected to source electrode 18 through a via 28 in dielectric spacer 22, a dielectric body 30 (formed preferably with $Ta_2O_3$) formed over first conductive plate 26, and conductive plate 32 (formed preferably with copper) formed over dielectric body 30, whereby capacitor 24 and MOSFET 16 are electrically and mechanically coupled and integrated into a single operative unit.

Figure 3A:
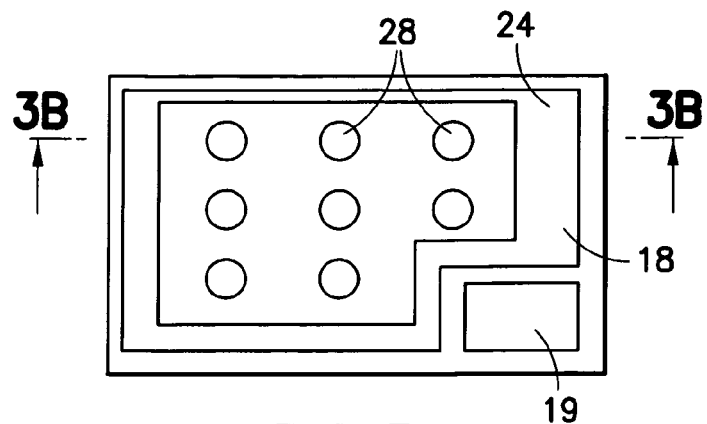
FIG. 3A schematically shows a top plan view of a power semiconductor device according to the third embodiment of the present invention.
Figure 3B:
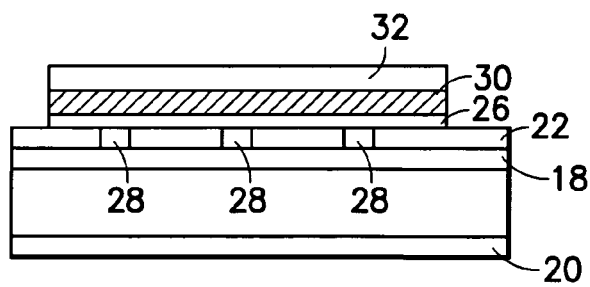
FIG. 3B schematically shows a cross-sectional view along line 3B-3B viewed in the direction of the arrows.

Referring to FIGS. 3A (showing a top plan view) and 3B (showing a cross-sectional view along line 3B-3B viewed in the direction of the arrows), according to the second embodiment, dielectric spacer 22 forms a passivation over at least source electrode 18 and alternatively the entire top surface of power MOSFET 16 except for gate electrode 19, and includes a plurality of vias 28. (Note that dielectric spacer 18 has been rendered transparent to better illustrate vias 28). Capacitor 24 is formed over dielectric spacer 22 covering preferably the entire top surface area of source electrode 18.

Figure 4:
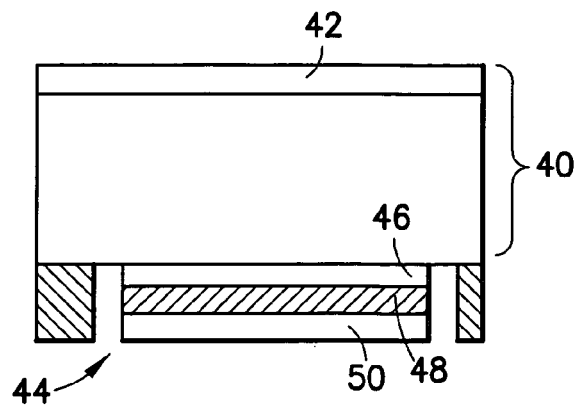
FIG. 4 schematically shows a power semiconductor device according to the third embodiment of the present invention.

Referring to FIG. 4, a device according to the third embodiment includes a power semiconductor device, such as a power MOSFET 40 which includes a source electrode 42, but does not include a drain electrode. Rather, a capacitor 44 is formed over the bottom surface of MOSFET 40 instead of a drain electrode. Capacitor 44 includes first conductive plate 46 (formed preferably with copper) directly connected to the bottom surface of MOSFET 40, dielectric body 48 (formed preferably with $Ta_2O_5$) formed over first electrode 46, and second conductive plate 50 (formed preferably with copper) formed over dielectric body 48.

A device according to the third embodiment is fabricated according to the following method:

A) a plurality of MOSFETs are formed in wafer form in any desired manner, but the back metal deposition is omitted;
B) a copper seed layer is applied to the back of the wafer;
C) copper is plated onto the seed layer using any known method such as electroless plating;
D) plated copper is polished;
E) a high dielectric such as $Ta_2O_3$ is deposited on the plated copper;
F) the dielectric is polished;
G) another copper seed layer is formed over the dielectric layer;
H) copper is plated on the another seed layer;
I) the plated copper is polished.

A capacitor in a device according to the present invention can also be formed on a conventional die (preferably at the wafer stage) using, for example, drop-on-demand techniques as disclosed in U.S. patent application Ser. No. 11/367,725, assigned to the assignee of the present invention, and incorporated herein by reference.

Figure 1:
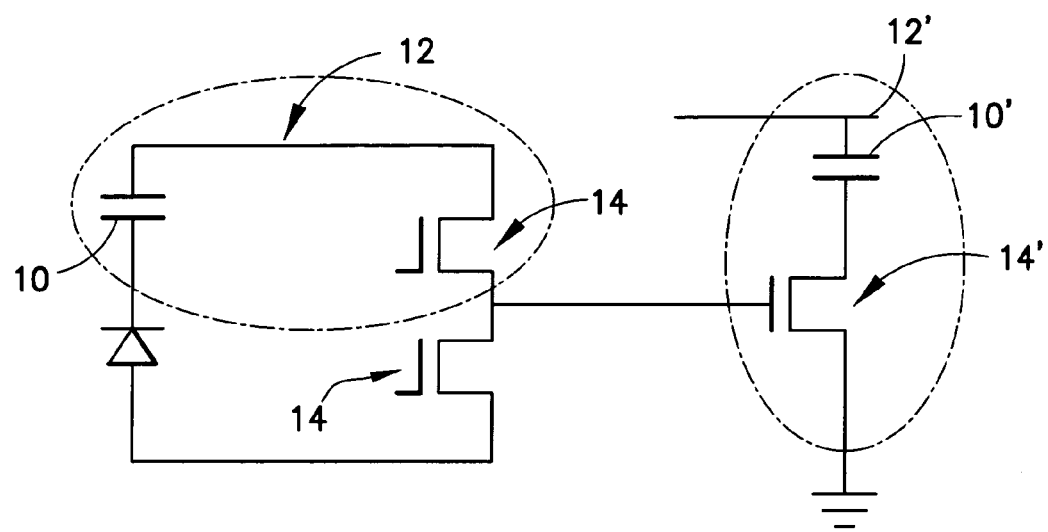
FIG. 1 shows a circuit diagram according to the prior art.

A device according to the third embodiment can be used, for example, in an application according to FIG. 1. For example, a MOSFET and a capacitor in the circuit according to FIG. 1 can be replaced with a device according to the present invention. Specifically, the combination of MOSFET 14 and capacitor 10 can be replaced with a device according to the present invention and used in a predriver circuit 12 as shown in FIG. 1, and/or the combination of MOSFET 14' and capacitor 10' can be replaced with a device according to the present invention and used in the power circuit 12' of FIG. 1.

In an alternative embodiment, instead of a capacitor, a diode may be mechanically and electrically integrated with a power switch using, for example, thin diode materials.

Although the present invention has been described in relation to particular embodiments thereof, many other variations and modifications and other uses will become apparent to those skilled in the art. It is preferred, therefore, that the present invention be limited not by the specific disclosure herein, but only by the appended claim.

What is claimed is:

1. A power semiconductor device comprising:
   a discreet power semiconductor switch having a first power electrode on one surface thereof; and
   a capacitor on another surface instead of a power electrode, said capacitor having a first conductive plate directly mechanically and electrically coupled to the semiconductor body of said power semiconductor switch.

2. The power semiconductor device of claim 1, wherein said power semiconductor switch is a power MOSFET.

3. The power semiconductor device of claim 1, wherein said first conductive plate is directly mechanically and electrically coupled to the drain region of a power MOSFET.

4. The power semiconductor device of claim 1, wherein said discreet power semiconductor device is configured for application in a driver circuit.

5. The power semiconductor device of claim 1, wherein said device is configured for use in a predriver circuit.

6. The power semiconductor device of claim 1, wherein said device is configured for use in a power circuit.

7. The power semiconductor device of claim 1, wherein said capacitor is formed using drop-on-demand fabrication.

8. A power semiconductor device comprising:
   a discreet power semiconductor switch;
   a capacitor mechanically coupled to a major portion of said power semiconductor switch and having a first conductive plate, a second conductive plate and a dielectric body disposed between said first conductive plate and said second conductive plate, and wherein said power semiconductor switch includes a first power electrode and a second power electrode, wherein said first conductive plate is electrically connected to said first power electrode.

9. The power semiconductor device of claim 8, further comprising a dielectric spacer disposed between said first power electrode and said first conductive plate serving to mechanically couple said first conductive plate to said first power electrode.

10. The power semiconductor device of claim 9, wherein said first conductive plate is electrically connected to said first power electrode through a conductive filled via in said dielectric spacer.

11. The power semiconductor device of claim 9, wherein said first conductive plate is electrically connected to said first power electrode through a plurality of conductive filled vias in said dielectric spacer.

12. The power semiconductor device of claim 8, wherein said first power electrode is the source electrode of a power MOSFET.

13. The power semiconductor device of claim 8, wherein said first power electrode is the drain electrode of a power MOSFET.

* * * * *